United States Patent [19]
Takahashi et al.

[11] Patent Number: 5,748,011
[45] Date of Patent: May 5, 1998

[54] OUTPUT BUFFER CIRCUIT

[75] Inventors: Makoto Takahashi, Yokohama; Kazutaka Nogami, Ichikawa, both of Japan

[73] Assignee: Kabushiki Kaisha Toshiba, Kawasaki, Japan

[21] Appl. No.: 701,675

[22] Filed: Aug. 22, 1996

[30] Foreign Application Priority Data

Aug. 22, 1995 [JP] Japan ................... 7-213464

[51] Int. Cl.⁶ ............... H03K 19/094; H03K 19/0175
[52] U.S. Cl. .................................... 326/83; 326/81
[58] Field of Search ............................. 326/81, 83

[56] References Cited

U.S. PATENT DOCUMENTS

| | | | |
|---|---|---|---|
| 3,995,171 | 11/1976 | Sonoda | 326/83 |
| 4,709,162 | 11/1987 | Braceras et al. | 326/83 |
| 4,782,250 | 11/1988 | Adams et al. | 326/81 |
| 4,963,766 | 10/1990 | Lundberg | |
| 5,144,165 | 9/1992 | Dhong et al. | 326/83 |
| 5,151,619 | 9/1992 | Austin et al. | |
| 5,206,544 | 4/1993 | Chen et al. | 326/81 |
| 5,387,826 | 2/1995 | Shay et al. | 326/83 |
| 5,406,140 | 4/1995 | Wert et al. | 326/81 |
| 5,418,476 | 5/1995 | Strauss | 326/58 |
| 5,534,795 | 7/1996 | Wert et al. | 326/83 |
| 5,576,635 | 11/1996 | Partovi et al. | 326/83 |
| 5,629,634 | 5/1997 | Carl et al. | 326/83 |

*Primary Examiner*—Edward P. Westin
*Assistant Examiner*—Richard Roseen
*Attorney, Agent, or Firm*—Oblon, Spivak, McClelland, Maier & Neustadt, P.C.

[57] ABSTRACT

In the output buffer circuit, when an enable signal is inputted to deactivate the main buffer circuit (MB1) and further when a voltage higher than the first supply voltage $V_{DD}$ is applied to the output terminal (I/O), since the fifth P-type transistor (QP2) is turned on, the voltage at the output terminal is applied to the gate of the third P-type transistor (QP1), so that this transistor (QP1) is perfectly turned off. Therefore, it is possible to prevent unnecessary current from flowing from the output terminal (I/O) to the first supply voltage ($V_{DD}$) terminal through the third P-type transistor (QP1). Further, since the sixth P-type transistor (QP4) is turned on, the voltage at the output terminal is applied to the gate of the second P-type transistor (QP6) through the sixth P-type transistor (QP4), so that this transistor (QP6) can be perfectly turned off. Therefore, it is possible to prevent unnecessary current from flowing to the first supply voltage ($V_{DD}$) terminal through the first and second P-type transistors (QP5 and QP6). Further, since a voltage higher than the first supply voltage will not be applied to the gate oxide film of the second to sixth P-type transistors all formed on the same N-type substrate, it is possible to prevent the manufacturing process from being complicated.

16 Claims, 3 Drawing Sheets

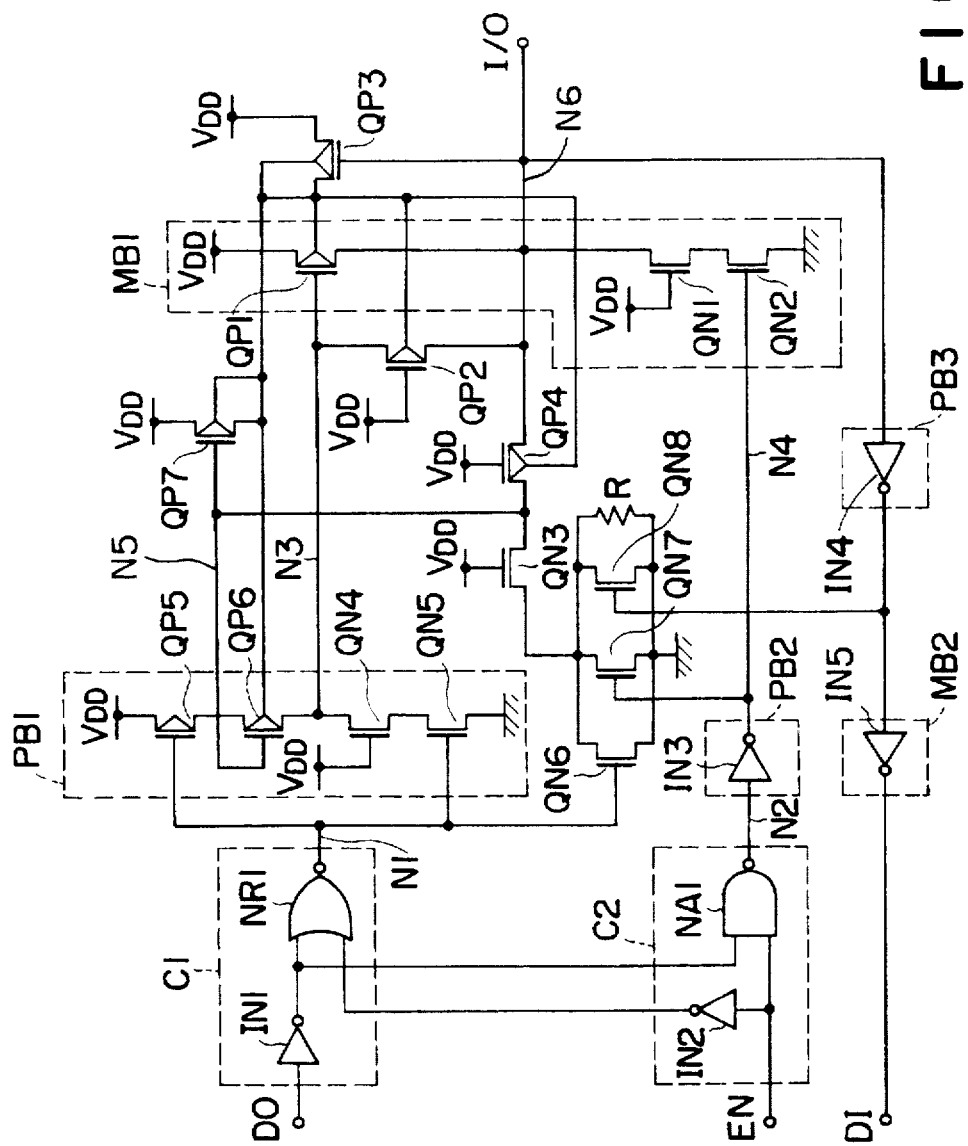
F I G. 1

OUTPUT BUFFER CIRCUIT

BACKGROUND OF THE INVENTION

1. Field of the Invention

The present invention relates to an output buffer circuit, and more specifically to an interface connected between two circuits of a plurality of circuits supplied with different supply voltages in spite of the same system.

2. Description of the Prior Art

Recently, the area of a semiconductor integrated circuit has been reduced more and more to increase both the integration density and the operating speed. In this case, the integrated circuit must be prevented from dielectric breakdown. In addition, the supply voltage is now being decreased to reduce the power consumption. In this case, in general although the supply voltage has been decreased from a high supply voltage (e.g., 5V) to a low supply voltage (e.g., 3.3V), it is impossible to change the entire system from the high supply voltage to the low supply voltage completely at a period. In other words, there exists the case where the same system includes a plurality of circuits supplied with different supply voltages. As a result, circuits so designed as to be operative stably at a high supply voltage (e.g., 5V) are to be directly connected to circuits so designed as to be operative stably at a low supply voltage (e.g., 3.3V). In general, the supply voltage of memory circuits or microprocessors has been more reduced, as compared with other peripheral circuits. As a result, there exists such a case that the memory circuit and the microprocessor are both operated at a low supply voltage of 3.3V and the peripheral circuits are operated at a high supply voltage of 5V, for instance.

In this case, when a signal with a large amplitude (e.g., 5V) outputted from a circuit operative at the high supply voltage (e.g., 5V) is received directly by a circuit operative at a low supply voltage (e.g., 3.3V), the following problems arise:

In the circuit operative at the low supply voltage, in general, a P-channel MOS transistor (referred to as P-type Tr, hereinafter) is connected between an external terminal and a low supply voltage terminal as a pull-up transistor. Therefore, when a 5V signal is inputted through the external terminal, since the P-type Tr originally turned off is turned on, unnecessary current flows from the external terminal to the low supply voltage terminal. In addition, unnecessary current flows from the external terminal to an N-type well substrate on which the P-type Trs are formed. Further, in general, since an N-channel type MOS transistor (referred to as N-type Tr, hereinafter) is connected between the external terminal and a ground voltage $V_{SS}$, when a voltage exceeding the breakdown voltage of the N-type Tr is applied to the gate oxide film thereof, the gate oxide film is broken down.

The prior art technique so far adopted against the above-mentioned problems are as follows: in the circuit operative at the low supply voltage (e.g., 3.3V), only an output buffer circuit thereof is changed so as to be operative at the high supply voltage (e.g., 5V). In this case, however, since a voltage conversion circuit is required between the internal circuit operative at the low supply voltage of 3.3V and the output buffer circuit operative at the high supply voltage of 5V, another problem arises in that the operation is delayed. Further, in the output buffer circuit, since transistors optimized at the low supply voltage cannot be used, transistors formed with an oxide film resistant against a high supply voltage of 5V must be manufactured, thus causing a rise in cost due to complication of the manufacturing process.

To overcome this problem, a buffer circuit using only the transistors optimized at the low supply voltage of 3.3V has been proposed by U.S. Pat. No. 5,151,619, entitled "CMOS off chip driver circuit" for instance, as shown in FIG. 3. This circuit is composed of a pre-buffer circuit PB11, a main buffer circuit having P-type Tr QP32 and N-type Tr QN32, P-type Trs QP31 and QP33 and N-type Tr QN31.

In this circuit shown in FIG. 3, when an output terminal DO is driven by another external circuit (not shown) and thereby the voltage $V_{out}$ at the output terminal DO reaches a voltage as $V_{DD} > V_{out} > V_{DD} - V_{thp}$, the P-type Tr QP31 is turned off. Therefore, since a gate of the pull-up transistor P-type Tr QP32 is charged up to a voltage of $V_{DD} - V_{thn}$ by the N-type Tr QN31, the pull-up transistor P-type Tr QP32 is turned on in a high impedance status. As a result, there exists a problem in that unnecessary current flows from the output terminal DO to the supply voltage $V_{DD}$ terminal. Here, $V_{thp}$ denotes the threshold voltage of the P-type Tr and $V_{thn}$ denotes the threshold voltage of the N-type Tr.

Further, another prior art buffer circuit is disclosed by U.S. Pat. No. 4,963,766, entitled "Low-voltage CMOS output buffer" for instance, as shown in FIG. 4. In this circuit, the main buffer circuit is composed of a P-type Tr QP42 and an N-type Tr QN47. Here, a supply voltage $V_{DDS}$ is applied to the substrate of the pull-up transistor of P-type Tr QP42 in order to prevent a forward bias voltage from being applied to the junction portion of the P-type Tr QP42.

In this circuit, when the output terminal (DO) voltage reaches 5V, the P-type Tr QP41 having a drain connected to the output terminal DO is turned on. Therefore, since the voltage of 5V (the same as at the output terminal DO) is applied to a gate of the P-type Tr QP42, this transistor Tr QP42 is turned off to prevent current from flowing from the output terminal DO to the supply voltage ($V_{DD}$) terminal.

In this prior art circuit, however, since the high supply voltage of 5V is applied to the gate oxide film of the N-type Tr QN43 and the N-type Tr QN47, these transistors must be manufactured so as to have the breakdown voltage more than 5V, thus causing a problem in that the manufacturing cost inevitably increases.

In summary, as described above, in the prior art buffer circuits, there exist some problems in that when current is prevented from flowing from the output terminal to the supply voltage terminal, since the level converting circuit must be provided, the high speed operation cannot be obtained or the gate oxide film having a breakdown voltage more than 5V must be formed, with the result that the manufacturing process is inevitably complicated.

SUMMARY OF THE INVENTION

With these problems in mind, therefore it is the object of the present invention to provide an output buffer circuit, which can prevent unnecessary current from flowing from the output terminal to the supply voltage terminal, while increasing the operation speed and decreasing the manufacturing cost thereof.

To achieve the above-mentioned object, the present invention provides an output buffer circuit, comprising: a pre-buffer control circuit for inputting data and an enable signal, and for outputting a first pre-buffer control signal and a second pre-buffer control signal; a first pre-buffer circuit for inputting the first pre-buffer control signal outputted by said pre-buffer control circuit and outputting a first signal, including: a first P-channel type MOS transistor having a gate for inputting the first pre-buffer control signal; a first N-channel type MOS transistor having a gate connected to a first supply voltage terminal; a second P-channel type MOS transistor having a gate connected to a first node; a second N-channel type MOS transistor having a gate for inputting the first pre-buffer control signal; and said first and second P-channel type MOS transistors and said first and second N-channel between the first supply voltage terminal and a second supply voltage terminal, and the first signal being outputted from a second junction node between said second P-channel type MOS transistor and said first N-channel type MOS transistor; a second pre-buffer circuit for inputting the second pre-buffer control signal outputted by said pre-buffer control circuit and outputting a second signal; a main buffer circuit for inputting the first and second signals and outputting a third signal from an output terminal, including: a third P-channel type MOS transistor having a gate for inputting the first signal; a third N-channel type MOS transistor having a gate connected to the first supply voltage terminal; a fourth N-channel type MOS transistor having a gate for inputting the second signal; and said third P-channel type MOS transistors and said third and fourth N-channel type MOS transistor being all connected in series between the first supply voltage terminal and a second supply voltage terminal, and a third junction node between said third P-channel type MOS transistor and said third N-channel type MOS transistor being connected to the output terminal; a fourth P-channel type MOS transistor having a source connected to the first supply voltage terminal, a gate connected to the output terminal, and a drain connected to an N-type substrate; a fifth P-channel type MOS transistor having a source connected to the second node, a gate connected to the first supply voltage terminal, and a drain connected to the output terminal; and a sixth P-channel type MOS transistor having a source connected to the output terminal, a gate connected to the first supply voltage terminal, and a drain connected to the first node.

Here, it is preferable that said second P-channel type MOS transistor and said third P-channel type MOS transistor are both connected to the same N-type substrate, and that the output buffer further comprises a seventh P-channel type MOS transistor having a source connected to the first supply voltage terminal, a gate connected to the first node, a drain connected to the N-type substrate.

Further, it is preferable that the output buffer further comprises: a fifth N-channel type MOS transistor having a drain connected to the first node and a gate connected to the first supply voltage terminal; and a resistance connected between a source of said fifth N-channel type MOS transistor and the second supply voltage terminal.

Further, it is preferable that the output buffer further comprises a sixth N-channel type MOS transistor having a source and a drain both connected in parallel to said resistance and a gate for inputting the first pre-buffer control signal.

Further, it is preferable that the output buffer further comprises a seventh N-channel type MOS transistor having a source and a drain both connected in parallel to said resistance and a gate for inputting the second signal.

Further, it is preferable that the output buffer further comprises: a third pre-buffer circuit connected to the output terminal, for inverting external data given through the output terminal from outside of the output buffer circuit and for outputting a fourth signal; a second main buffer circuit connected to said third pre-buffer circuit, for inverting the fourth signal outputted by said third pre-buffer circuit and for outputting a fifth signal; and an eighth N-channel type MOS transistor having a source and a drain both connected in parallel to said resistance and a gate for inputting the fourth signal.

Further, the present invention provides an output buffer circuit, comprising: a first pre-buffer control circuit for inputting data and an enable signal and for outputting a first pre-buffer control signal and a second pre-buffer control signal; a first pre-buffer circuit for inputting the first pre-buffer control signal outputted by said pre-buffer control circuit and outputting a first signal, including: a first P-channel type MOS transistor having a gate for inputting the first pre-buffer control signal; a first N-channel type MOS transistor having a gate connected to a first supply voltage terminal; a second N-channel type MOS transistor having a gate for inputting the first pre-buffer control signal; and said first P-channel type MOS transistor and said first and second N-channel type MOS transistors being all connected in series between a first node and the second supply voltage terminal, and the first signal being outputted from a second junction node between said first P-channel type MOS transistor and said first N-channel type MOS transistor; a second pre-buffer circuit for inputting the second pre-buffer control signal outputted by said pre-buffer control circuit and outputting a second signal; a main buffer circuit for inputting the first and second signals and outputting a third signal from an output terminal, including: a second P-channel type MOS transistor having a gate for inputting the first signal; a third N-channel type MOS transistor having a gate connected to the first supply voltage terminal; a fourth N-channel type MOS transistor having a gate for inputting the second signal; and said second P-channel type MOS transistor and said third and fourth N-channel type MOS transistors being all connected in series between the first supply voltage terminal and a second supply voltage terminal, and a third junction node between said second P-channel type MOS transistor and said third N-channel type MOS transistor being connected to the output terminal; a third P-channel type MOS transistor having a source connected to the first supply voltage terminal, a gate connected to the output terminal, and a drain connected to an N-type substrate; a fourth P-channel type MOS transistor having a source connected to the second node, a gate connected to the first supply voltage terminal, and a drain connected to the output terminal; and a fifth P-channel type MOS transistor connected between an output of said first pre-buffer control circuit and the gate of said first P-channel type MOS transistor and having a gate connected to the second supply voltage terminal.

Further, it is preferable that said first, second, third, fourth and fifth P-channel type MOS transistors are all connected to the same N-type substrate, and that the output buffer further comprises a sixth P-channel type MOS transistor having a source and a gate both connected to the first supply voltage terminal, and a drain connected to a gate of said first P-channel type MOS transistor.

In the output buffer circuit according to the present invention, when an enable signal is inputted to deactivate the main buffer circuit and further when a voltage higher than the first supply voltage $V_{DD}$ is applied to the output terminal, since the fifth P-type transistor is turned on, the voltage at the output terminal is applied to the gate of the third P-type transistor, so that this transistor is perfectly turned off. Therefore, it is possible to prevent unnecessary current from flowing from the output terminal to the first supply voltage terminal through the third P-type transistor. Further, since the sixth P-type transistor is turned on, the voltage at the output terminal is applied to the gate of the second P-type transistor through the sixth P-type transistor, so that this transistor can be perfectly turned off. Therefore, it is possible to prevent unnecessary current from flowing to the first supply voltage terminal through the first and second P-type transistors. Further, since a voltage higher than the first supply voltage will not be applied to the gate oxide film of the second to sixth P-type transistors all formed on the same N-type substrate, it is possible to prevent the manufacturing process from being complicated.

BRIEF DESCRIPTION OF THE DRAWINGS

FIG. 1 is a circuit diagram showing a first embodiment of an output buffer circuit according to the present invention;

DETAILED DESCRIPTION OF THE PREFERRED EMBODIMENTS

Figure 2:
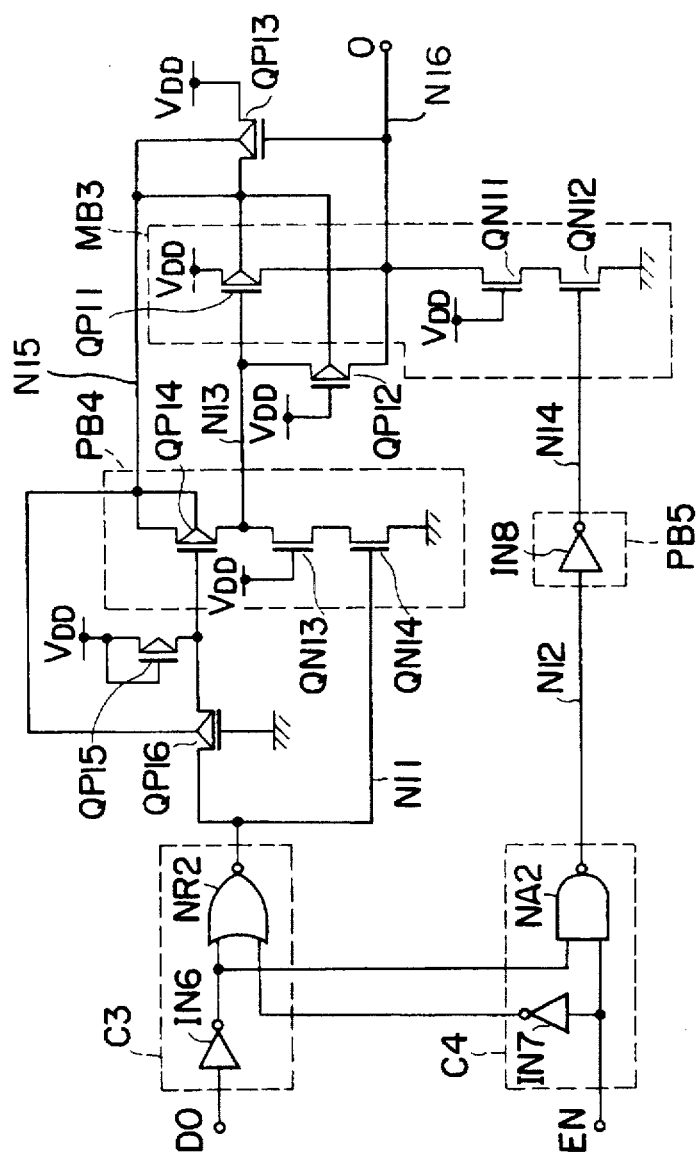
FIG. 2 is a circuit diagram showing a second embodiment of an output buffer circuit according to the present invention.
Figure 3:
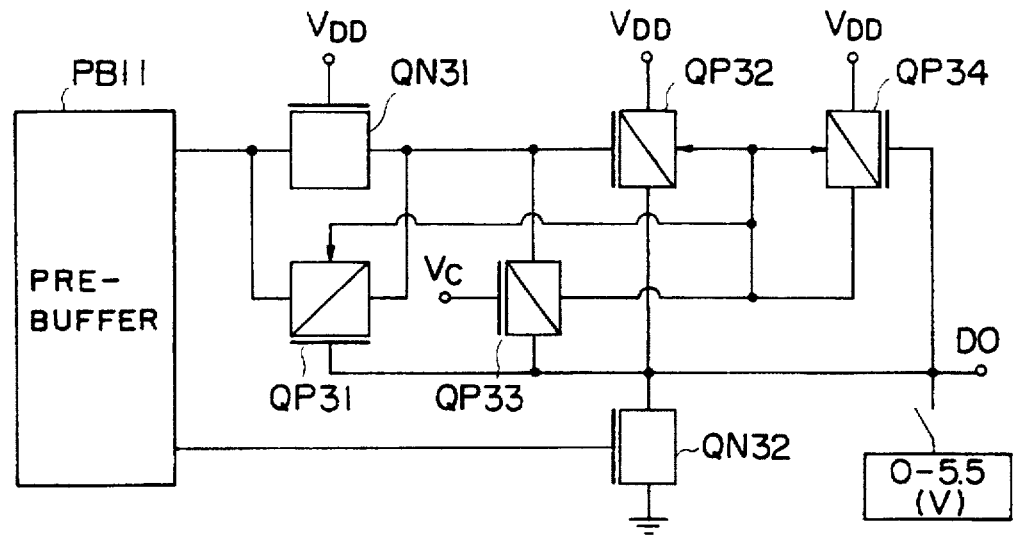
FIG. 3 is a circuit diagram showing a prior art output buffer circuit.
Figure 4:
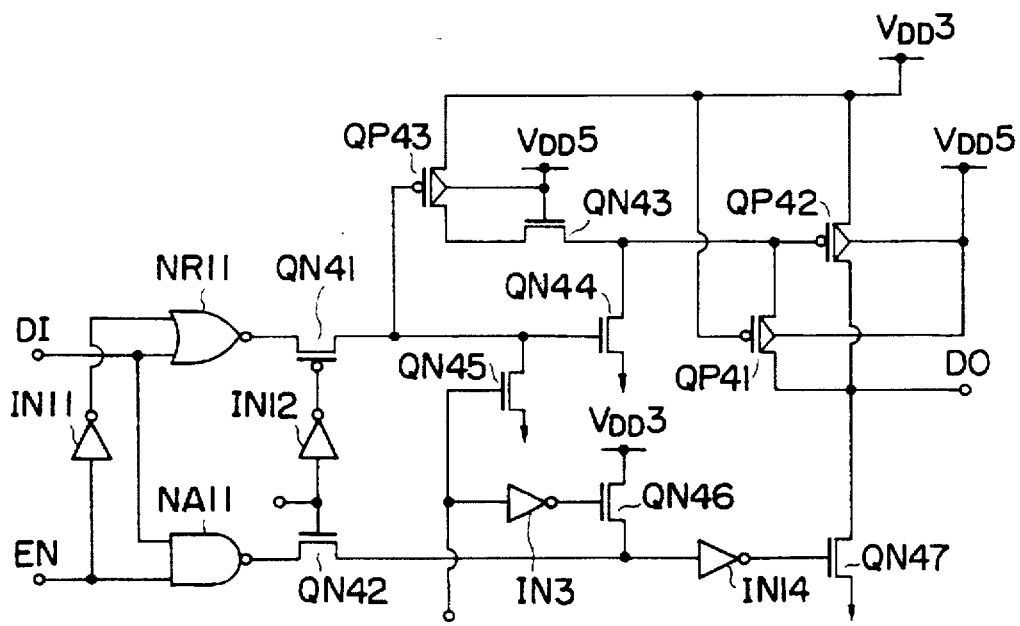
FIG. 4 is a circuit diagram showing another prior art output buffer circuit.

The embodiments of the output buffer circuit according to the present invention will be described hereinbelow with reference to the attached drawings.

FIG. 1 shows a first embodiment thereof. This output buffer circuit is provided with both the functions as an input buffer and an output buffer.

The input/output buffer circuit is composed of a data output terminal DO, a data input terminal DI, an enable signal input terminal EN, an input/output terminal I/O, two pre-buffer control circuits C1 and C2, three pre-buffer circuits PB1, PB2 and PB3, two main buffer circuits MB1 and MB2, four P-type Trs QP2 to QP4 and QP7, four N-type Trs QN3 and QN6 to QN8, and a resistance R.

The pre-buffer control circuit C1 includes an inverter IN1 having an input terminal connected to the data output terminal DO, and a NOR gate NR1 having one input terminal connected to an output terminal of the inverter IN1 and an output terminal connected to a node N1. The pre-buffer control circuit C2 includes an inverter IN2 having an input terminal connected to the enable signal input terminal EN and an output terminal connected to the other input terminal of the NOR gate NR1, and a NAND gate NA1 having two input terminals connected to the enable signal input terminal EN and the output terminal of the inverter IN1 and an output terminal connected to a node N2.

The pre-buffer circuit PB1 is composed of two P-type Trs QP5 and QP6 and two N-type Trs QN4 and QN5 all connected in series between a supply voltage $V_{DD}$ and a ground voltage $V_{SS}$. Here, a gate of the N-type Tr QN4 is connected to a supply voltage $V_{DD}$ terminal. A drain of the P-type Tr QP6 and a drain of the N-type Tr QN4 are connected in common to an output node N3 of the pre-buffer circuit PB1.

The pre-buffer circuit PB2 is an inverter IN3 having an input terminal connected to the node N2 and an output terminal connected to an output node N4 of the pre-buffer circuit PB2.

The main buffer circuit PB1 is composed of a P-type Tr QP1 and two N-type Trs QN1 and QN2. Here, a gate of the P-type Tr QP1 is connected to the node N3, and a gate of the N-type Tr QN1 is connected to the supply voltage $V_{DD}$ terminal. A gate of the N-type Tr QN2 is connected to the node N4.

Further, the P-type Trs QP1 to QP4 and QP6 and QP7 are all formed on a common N-type well substrate. A source of the P-type Tr QP3 is connected to the supply voltage $V_{DD}$ terminal and a drain thereof is connected to the N-type well substrate. A source of the P-type Tr QP2 is connected to the gate N3, and a gate thereof is connected to the supply voltage $V_{DD}$ terminal, and a drain thereof is connected to an input/output terminal I/O. A drain of the P-type Tr QP4 is connected to gates of the P-type Trs QP6 and QP7, and a source thereof is connected to the input/output terminal I/O. A source of the P-type Tr QP7 is connected to the supply voltage $V_{DD}$ terminal and a drain thereof is connected to the N-type well substrate. A gate of the N-type Tr QN3 is connected to the supply voltage $V_{DD}$ terminal, a drain thereof is connected to the drain of the P-type Tr QP4 and both the gates of the P-type Trs QP6 and QP7, and a source thereof is connected in common to drains of the N-type Trs QN6 to QN8 and the resistance R. Sources of the N-type Trs QN6 to QN8 are connected in common to the ground voltage $V_{SS}$ terminal. A gate of the N-type Tr QN6 is connected to the node N1, and a gate of the N-type Tr QN7 is connected to the node 4, and a gate of the N-type Tr QN7 is connected to a junction node between the two inverters IN4 and IV5. The resistance R is connected between the drains and sources of the N-type Trs QN7 to QN8 connected in parallel to each other.

The operation of the first embodiment of the input/output buffer circuit will be described hereinbelow.

The input/output buffer circuit operates as an input buffer circuit or an output buffer circuit, respectively according to the logical level of the enable signal inputted to the enable signal input terminal EN.

That is, when a high-level enable signal is inputted thereto, the input/output buffer circuit operates as an output buffer circuit. In this case, data are outputted from an internal circuit of a semiconductor circuit device including this input/output buffer circuit, and then inputted to the two pre-buffer control circuits C1 and C2 through the data output terminal DO. A signal having the same in logical level as that of the inputted data is inputted to the two pre-buffer circuits PB1 and PB2 through the two output nodes N1 and N2 of the pre-buffer control circuits C1 and C2, respectively. The data inverted by the pre-buffer circuits PB1 and PB2, respectively are inputted to the main buffer MB1 through the node N3 and N4, so that the data having the original logical level can be outputted to an external device through the input/output terminal I/O.

In contrast with this, when a low-level enable signal is inputted to the enable signal input terminal EN, since the node N1 is fixed to the low level and the node N2 is fixed to the high level respectively, irrespective of the input data, both the P-type Tr QP1 and N-type Tr QN2 of the main buffer circuit MB1 are both turned off, so that the circuit will no more operate as the output buffer. In this case, data inputted through the input/output terminal I/O from the outside of the device is amplified by the pre-amplifier circuit PB3 and the main buffer circuit MB2 and further transferred to the internal circuit through the data input terminal DI.

Here, the above-mentioned input/output buffer circuit is provided with such two functions that it is possible to control a voltage applied to the N-type well substrate (on which the P-type Trs QP1 to QP4 and QP6 and QP7 are formed) and further to prevent unnecessary current from flowing into the N-type well substrate or the supply voltage $V_{DD}$ terminal. These functions will be described hereinbelow. These two functions will be described hereinbelow. Further, in FIG. 1, the supply voltage $V_{DD}$ is assumed to be 3.3V.

In the case where the high-level enable signal is inputted to operate the input/output circuit as an output buffer and further a voltage of 3.3V is outputted from the input/output terminal I/O to the outside, or in the case where the low-level enable signal is inputted to operate the input/output circuit as an input buffer (the main buffer circuit MB1 is inoperative) and further a voltage of 3.3V is applied to the outside to the input/output terminal I/O, the P-type Tr QP3 is turned off, so that current is prevented from flowing from the supply voltage $V_{DD}$ terminal to the N-type well substrate or the drain thereof. In this case, however, since the P-type Tr QP7 is turned on, the voltage of 3.3V is supplied to the N-type well substrate.

In the case where the low-level enable signal is inputted to operate the input/output circuit as an input buffer and further a voltage of 5V is applied from the outside to the input/output terminal I/O, the P-type Tr QP4 is turned on. Therefore, the voltage of 5V applied to the input/output terminal I/O is applied to the gate of the P-type Tr QP7 via the P-type Tr QP4, so that the Tr QP7 is turned off. As a result, since the voltage of 5V is not directly supplied to the N-type well substrate through the P-type Tr QP4, it is possible to prevent current from flowing to the N-type well substrate through the PN junctions of the P-type Trs QP1, QP2 and QP4 all connected to the input/output terminal I/O.

In other words, even when the voltage of 5V is applied to the input/output terminal I/O from the external circuit, current will not flow directly from the input/output terminal I/O to the N-type well substrate; that is, current flows through only the PN junctions of the P-type Trs QP1, QP2 and QP4. As a result, it is possible to prevent unnecessary current from flowing from the input/output terminal I/O to the supply voltage $V_{DD}$ terminal through the N-type well substrate.

Further, when the voltage of 5V is applied to the input/output terminal I/O, since the voltage of 5V is applied to the gate of the P-type Tr QP1 through the turned-on P-type Tr QP2, the P-type Tr QP1 is perfectly turned off. Therefore, it is possible to prevent unnecessary current from flowing from the input/output terminal I/O to the supply voltage $V_{DD}$ terminal through the P-type Tr QP1.

Further, when the gate voltage of the P-type Tr QP1 reaches about 5V, since the voltage of 5V at the input/output terminal I/O is applied to the gate of the P-type Tr QP6 through the turned-on P-type Tr QP4, the P-type Tr QP6 is perfectly turned off. Therefore, since the voltage of 5V at the input/output terminal I/O is not supplied to the drain of the P-type QP5 through the P-type Tr QP6, it is possible to prevent unnecessary current from flowing to the supply voltage $V_{DD}$ terminal through the P-type Tr QP5.

Further, when the voltage of 5V is being applied to the input/output terminal I/O, the gate of the P-type Tr QP6 is charged by the supply voltage $V_{DD}$. The gate of the P-type Tr QP6 is connected to the drain of the N-type Tr QN3 having the gate connected to the supply voltage $V_{DD}$, further the N-type Trs QN6 to QN8 and the resistance R are connected in parallel between the source of the N-type Tr QN3 and the ground voltage terminal $V_{SS}$. Therefore, since the charge now being charged at the gate of the P-type Tr QP6 can be pulled down to the ground voltage $V_{SS}$, it is possible to turned off the P-type Tr QP6 perfectly.

Further, when the high level enable signal is inputted to operate the circuit as the output buffer and further the high level (3.3V) signal is outputted from the input/output terminal I/O to the outside, the P-type Tr QP1 of the main buffer circuit MB1 is turned on. At this time, since a high level pre-buffer control signal is being outputted from the pre-buffer control circuit C1 to the node N1, the N-type Tr QN6 is turned on.

In contrast with this, when the low level signal is outputted from the input/output terminal I/O, since the high level (3.3V) voltage is applied from the node N4 to the gate of the N-type Tr QN2 of the main buffer circuit MB1, the Tr QN2 is turned on. Further, since the input/output terminal I/O is at the low level, the output side of the inverter IV4 is inverted to the high level, so that the N-type Tr QN7 is turned on in response to this high level signal. As a result, unnecessary current is not consumed through the resistance R. Further, it is possible to prevent unnecessary current from flowing to the ground voltage $V_{SS}$ terminal, even if the P-type Tr QP1 is not perfectly turned off.

Here, since the supply voltage $V_{DD}$ is applied to the gate of the N-type Tr QN3, the N-type Tr QN3 is kept turned on at all times. Therefore, even when the voltage of 5V is applied to the input/output terminal I/O, since a voltage dropped by the threshold voltage of the turned-on N-type Tr QN3 is kept applied to the resistance R, it is possible reduce the current consumption through the resistance R. Further, in this case, since the gate-drain voltage $V_{gd}$ of the N-type Trs QN6 to QN8 can be reduced, it is possible to reduce the breakdown voltage required for the gate oxide film formed for these transistors. In the same way, since the supply voltage $V_{DD}$ is applied to the gate of the N-type Trs QN1 and QN4 and thereby these two transistors are kept turned on, it is possible to reduce both the power consumption and the breakdown voltage required for the gate oxide films of these transistors.

Further, in the first embodiment shown in FIG. 1, the gates of the P-type Trs QP6 and QP7 are denoted by a node N5, and the input/output terminal I/O is denoted by a node N6.

FIG. 2 shows a second embodiment of the output buffer circuit according to the present invention. This output buffer circuit is not provided with the function as an input buffer, being different from the first embodiment shown in FIG. 1.

Data transferred from an internal circuit of the device including this output buffer circuit to the outside of the device is inputted to the data output terminal DO. To this data output terminal DO, an input side of a pre-buffer control circuit C3 having an inverter IN6 and a NOR gate NR2 is connected. Further, to this output node N1 of the pre-buffer control circuit C3, a gate of a P-type Tr QP14 of a pre-buffer circuit PB4 is connected through a P-type Tr QP16 having a grounded gate. Further, to this output node N1 of the pre-buffer control circuit C3, a gate of an N-type Tr QN14 of the pre-buffer circuit PB4 is connected. Further, to a junction node between a drain of a P-type Tr QP16 and a gate of the P-type Tr QP14, a drain of a P-type Tr QP15 having a gain and a source connected in common to the supply voltage $V_{DD}$ terminal is connected.

The pre-buffer circuit PB4 is composed of the P-type Tr QP14 having a source connected to an N type well substrate, and the two N-type Trs QN13 and QN14 connected in series between a drain of the P-type Tr QP14 and the ground voltage $V_{SS}$. A gate of the N-type Tr QN13 is connected to the supply voltage $V_{DD}$ terminal.

To an enable signal input terminal IN (to which an enable signal is inputted), an input side of a pre-buffer control circuit C4 composed of an inverter IN7 and a NAND gate NA2 is connected. To an output node N12 of the pre-buffer control circuit C4, an input side of a pre-buffer circuit PB5 having an inverter IN8 is connected.

To a junction node N13 between the drain of the P-type Tr QP14 and a drain of the N-type Tr QN13 of the pre-buffer circuit PB4, a gate of a P-type QP11 of the main buffer circuit MB3 is connected. Further, to this node N13, a source of the P-type Tr QP12 having a gate connected to the supply voltage $V_{DD}$ is connected. The main buffer circuit MB3 is composed of the P-type Tr QP11, an N-type QN11 having a gate connected to the supply voltage $V_{DD}$, and an N-type TrQN12 having a gate connected to an output node N14 of the pre-buffer circuit PB5, all connected in series between the supply voltage $V_{DD}$ and the grounded voltage $V_{SS}$.

When a high level enable signal is inputted to the enable signal input terminal EN, this circuit operates as an output buffer circuit, and when a low level enable signal is inputted, this circuit is set to a non-operative status.

In the case of the high level enable signal, a pre-buffer control signal corresponding to the data level inputted to the data output terminal DO is outputted to the nodes N11 and N12, respectively. Therefore, when a high level data is inputted to the data output terminal DO, the node N11 is at the high level, and the node N12 is at the low level. Since the two signals are inverted by the pre-buffer circuits PB4 and PB5, respectively, the node N13 is at the low level and the node N14 is at the high level. The two signals at the nodes N13 and N14 are inputted to the main buffer circuit MB3, so that data same as the logical level of the input data can be outputted to the outside of the device through an output terminal O.

On the other hand, when a low level enable signal is inputted, the main buffer circuit MB3 is inoperative and at a high impedance status, irrespective of the logical level of the data.

Here, the function of the P-type Trs QP11 to QP14 and QP16 all formed on the same N-type well substrate will be described hereinbelow.

When the voltage at the output terminal O drops below an addition of the supply voltage $V_{DD}$ (3V) and the threshold voltage $V_{thp}$ of the P-type Tr QP3, the P-type Tr QP13 is turned on, so that the supply voltage $V_{DD}$ is supplied from the supply voltage $V_{DD}$ terminal connected to the source of the P-type Tr QP13 to the N-type well substrate connected to the drain of the P-type Tr QP13. Therefore, the N-type well substrate can be fixed at this voltage $V_{DD}$.

Since the supply voltage $V_{DD}$ is applied to the gate of the P-type Tr QP12, when the voltage at the output terminal O rises beyond a voltage of $(V_{DD}-V_{thp})$, the P-type Tr QP12 is turned on. Then, the node N11 connected to the gate of the P-type Tr QP11 is the same in level as the output terminal O, so that the P-type Tr QP11 is turned on. As a result, it is possible to prevent unnecessary current from flowing from the output terminal O to the supply voltage $V_{DD}$ terminal.

Here, the P-type Tr QP16 having a drain connected to the node N11 and having a grounded gate is always kept turned on. This transistor QP16 is provided to transfer a voltage (dropped from the output of the pre-buffer control circuit C3 by the conductive resistance) to the gate of the P-type Tr QP14. The P-type Tr QP15 having a drain connected to a junction point between the source of the P-type Tr QP16 and the gate of the P-type Tr QP14 is provided to keep conduction between the supply voltage $V_{DD}$ terminal and the gate of the P-type Tr QP14, in such a way that the gate voltage of the P-type Tr QP14 is not excessively reduced below a predetermined level.

The functions of the respective transistors will be described hereinbelow in the following various cases on condition that the high level enable signal is being inputted to activate the output buffer circuit: (1) when the voltage at the output terminal O changes from 0 V to $V_{DD}$ (3.3V) level; (2) when the voltage at the output terminal O changes from $V_{DD}$ (3.3V) to 0 V; (3) when the voltage at the output terminal O changes from 5V (applied from the external circuit) to $V_{DD}$ (3.3V); and (4) when the voltage at the output terminal O changes from 5V to 0V, respectively.

First, the voltage level at the output terminal O changes from 0V to $V_{DD}$ (3.3V) as follows: since the output terminal O is first at 0V, the P-type Tr QP13 is turned on, so that the supply voltage $V_{DD}$ is applied to the N-type well substrate.

Under these conditions, when the high level data D is inputted to the data output terminal DO, since the node N11 changes to the high level, so that the gate voltages of both the P-type Tr QP14 and the N-type Tr QN14 change to the high level. Therefore, since the node N13 is at the low level, the P-type Tr QP11 is turned on, so that the output terminal O is charged. When the voltage level of this output terminal O rises up to a voltage of $(V_{DD}+V_{thp})$, the N-type well substrate is maintained at roughly the supply voltage $V_{DD}$, although being floated.

The voltage level of the output terminal O changes from $V_{DD}$ (3.3V) to 0V as follows: when the low level data is inputted to the data input terminal DO, since the node N13 is at the high level, the P-type Tr QP11 of the main buffer circuit MB3 is turned off. On the other hand, since the node N14 is at the high level, the N-type Tr QN12 of the main buffer circuit MB3 is turned off. As a result, the voltage charged at the output terminal O is discharged by the N-type Tr QN12 down to 0V. The N-type well substrate on which the P-type Trs QP11 to QP14 and QP16 is first floated as described above. In this case, however, when the voltage at the output terminal O drops below $(V_{DD}+V_{thp})$, since the P-type Tr QP13 is turned on, the supply voltage $V_{DD}$ is applied to the N-type well substrate again, so that the substrate is kept at a constant voltage.

The voltage level of the output terminal O changes 5V (applied by the external circuit) to $V_{DD}$ (3.3V) as follows: when the output terminal O is at 5V, since the P-type Tr QP12 is turned on and thereby the node N13 changes to a level roughly the same as that of the output terminal O, so that the P-type Tr QP14 is turned on.

Then, when the high level data is inputted to the data output terminal DO, since the node N11 changes to the high level, the N-type and Tr QN14 is turned on. In this case, when the dimension ratio of the P-type Trs QP12 to QP14 and that of the N-type Trs QN13 to QN14 are both determined approximately, it is possible to decrease the voltage at the output terminal O gradually, while maintaining the voltage level at the node N13 connected to the gate of the P-type Tr QP11 at an intermediate voltage. Therefore, it is possible to prevent a high voltage exceeding 3V from being applied to the gate oxide film of these transistors.

When the voltage at the node N13 reaches the intermediate voltage, since the P-type Tr QP11 is turned on in a high impedance status, the voltage level at the output terminal O drops gradually to the voltage $V_{DD}$. Here, when the voltage level of the output terminal O is below $(V_{DD}-V_{thp})$, the P-type Trs QP12 and QP14 are both turned off, so that the gate voltage of the P-type Tr QP11 is at 0V. In this case, however, since the voltage at the output terminal O is relatively low, a voltage higher than 3V is not applied to the gate oxide film of any of these transistors.

The voltage level of the output terminal O changes from 5V to 0V as follows: when the voltage of the output terminal O is 5V, since the P-type Trs QP12 and QP14 are both turned on, the gate voltage of the P-type Tr QP14 is at $-V_{thp}$. Therefore, a voltage of $(5V-V_{thp})$ is applied to the gate oxide film thereof. Therefore, when the threshold voltage $V_{thp}$ of the P-type Tr QP14 is set to $(-1$ to $-1.4V)$, it is possible to prevent a voltage higher than 3V from being applied to the gate oxide film. Then, when the low level data is inputted through the data output terminal O, since the node N14 changes to the high level, the N-type Tr QN12 is turned on, so that the output terminal O is discharged down to 0V.

Further, on condition that the low level enable signal is inputted to the enable input terminal EN and thereby the main buffer circuit MB3 is in a high impedance status without being operated, when the voltage level of the output terminal O changes from $V_{DD}$ (3.3V) to 5V as follows: when the output terminal O is at $V_{DD}$, the P-type Tr QP14 is turned on, so that the gate voltage of the N-type Tr QP14 is at $-V_{thp}$. Therefore, the N-type well substrate is in a floating status at roughly $V_{DD}$. When the output terminal O rises from $V_{DD}$ to $(V_{DD}+V_{thp})$, the P-type Tr QP12 is turned on, so that the voltage level of the output terminal O is roughly equal to that at the node N13. Here, since the P-type Tr QP14 is already turned on and further since the voltage level of the N-type well substrate is roughly equal to that of the output terminal O, the voltage at the output terminal O rises 5V soon. Here, when the threshold voltage $V_{thp}$ of the P-type Tr QP14 is set to (−1 to −1.4V) by utilizing the substrate bias effect, it is possible to prevent a voltage higher than 3V from being applied to the gate of the P-type Tr QP14.

The low level enable signal is inputted and further the voltage level of the output terminal O changes from 5V to $V_{DD}$ as follows: this case is the same as with the case where the output terminal O changes from $V_{DD}$ to 5V, so that it is possible to prevent a high voltage from being applied to the gate oxide film of the transistors. Further, when the voltage level of the output terminal O drops below $(V_{DD}-V_{thp})$, since the P-type Tr QP12 is turned off, the N-type well substrate and the gate voltage of the P-type Tr QP11 are both floated at roughly $(V_{DD}-V_{thp})$.

Further, in the second embodiment shown in FIG. 2, the N-type well substrate is denoted by a node N15, and the output terminal is denoted by a node 16.

As described above, in the first and second embodiments of the output buffer circuit according to the present invention, it is possible to prevent unnecessary current from flowing to the supply voltage $V_{DD}$. Further, since a voltage higher than 3V is not applied to the gate oxide film of the transistors, it is possible to use the transistors designed so as to be optimized at the supply voltage of 3.3V. In other words, since transistors optimized at the supply voltage of 5V are not required to be manufactured, it is possible to prevent the manufacturing process from being complicated, thus reducing the manufacturing cost.

Further, when the supply voltage $V_{DD}$ (3.3V) is outputted to the outside, in the prior art output buffer circuit, although the supply voltage $V_{DD}$ is not supplied to the N-type well substrate, the N-type well substrate is floated. In the present invention, however, since the supply voltage $V_{DD}$ can be supplied to the N-type well substrate, it is possible to stabilize the N-type well substrate at a constant voltage.

Further, in the prior art output buffer, when the output terminal is at the voltage range between $(V_{DD}-V_{thp})$ and $V_{DD}$, since the gate of the pull-up P-type transistor does not reach a necessary high level, there exists an unstable status that the transistor is not perfectly turned off, so that unnecessary current flows from the output terminal to the supply voltage $V_{DD}$ through the pull-up P-type transistor. In contrast with this, in both the first and second embodiments, even when the voltage of the input/output terminal I/O (of the first embodiment) or the output terminal O (of the second embodiment) is in a range from 0V to 5V, it is possible to prevent unnecessary current from being generated.

The above-mentioned first and second embodiments have been described only by way of example. Without being limited only thereto, therefore, various modifications can be made. For instance, although the supply voltage $V_{DD}$ is set to 3.3V and the higher voltage is set to 5V, without being limited only to these voltages, the output buffer according to the present invention can be used between the circuits operative at different supply voltages. Further, in the case of the first embodiment, since the input buffer circuit is incorporated in the output buffer circuit, another input buffer circuit is not required. Further, in the second embodiment, although the input buffer circuit is not incorporated therein, it is possible to add the input buffer circuit to the output buffer circuit, in the same way as with the case of the first embodiment.

As described above, in the output buffer circuit of the first embodiment according to the present invention, on the same N-type substrate on which a second P-type transistor (QP6) of a first pre-buffer circuit (PB1) and a third P-type transistor (QP1) of a main buffer circuit (MB1) are formed, a fourth P-type transistor (QP3) having a source connected to a first supply voltage ($V_{DD}$), a gate connected to an output terminal (I/O) and a drain connected to the N-type substrate; a fifth P-type transistor (QP2) having a source connected to a gate of the third P-type Tr (QP1), a gate connected to the first supply voltage terminal and a drain connected to the output terminal (I/O); and a sixth P-type transistor (QP4) having a source connected to the output terminal, a gate connected to the first supply voltage and a drain connected to a gate of the second P-type transistor (QP6). Therefore, even if a voltage higher than the first supply voltage ($V_{DD}$) is applied to the output terminal (I/O), since unnecessary current will not flow from the output terminal to the first supply voltage ($V_{DD}$) terminal via the third P-type transistor (QP1) or the first and second P-type transistors (QP5 and QP6), it is possible to prevent the voltage higher than the first supply voltage from being applied to the gate oxide film, so that the complicated manufacturing process can be averted.

What is claimed is:

1. An output buffer circuit, comprising:
   a pre-buffer control circuit for inputting data and an enable signal, and for outputting a first pre-buffer control signal and a second pre-buffer control signal;
   a first pre-buffer circuit for inputting the first pre-buffer control signal outputted by said pre-buffer control circuit and outputting a first signal, including:
      a first P-channel type MOS transistor having a gate for inputting the first pre-buffer control signal;
      a first N-channel type MOS transistor having a gate connected to a first supply voltage terminal;
      a second P-channel type MOS transistor having a gate connected to a first node;
      a second N-channel type MOS transistor having a gate for inputting the first pre-buffer control signal; and
      said first and second P-channel type MOS transistors and said first and second N-channel type MOS transistors being all connected in series between the first supply voltage terminal and a second supply voltage terminal, and the first signal being outputted from a second junction node between one end of said second P-channel type MOS transistor and one end of said first N-channel type MOS transistor;
   a second pre-buffer circuit for inputting the second pre-buffer control signal outputted by said pre-buffer control circuit and outputting a second signal;

a main buffer circuit for inputting the first and second signals and outputting a third signal from an output terminal, including:
- a third P-channel type MOS transistor having a gate for inputting the first signal;
- a third N-channel type MOS transistor having a gate connected to the first supply voltage terminal;
- a fourth N-channel type MOS transistor having a gate for inputting the second signal; and
- said third P-channel type MOS transistors and said third and fourth N-channel type MOS transistor being all connected in series between the first supply voltage terminal and a second supply voltage terminal, and a third junction node between one end of said third P-channel type MOS transistor and one end of said third N-channel type MOS transistor being connected to the output terminal;

a fourth P-channel type MOS transistor having a source connected to the first supply voltage terminal, a gate connected to the output terminal, and a drain connected to an N-type substrate;

a fifth P-channel type MOS transistor having a source connected to the second node, a gate connected to the first supply voltage terminal, and a drain connected to the output terminal; and a sixth P-channel type MOS transistor having a source connected to the output terminal, a gate connected to the first supply voltage terminal, and a drain connected to the first node.

2. The output buffer circuit according to claim 1, wherein said second P-channel type MOS transistor and said third P-channel type MOS transistor are both connected to the same N-type substrate, and which further comprises a seventh P-channel type MOS transistor having a source connected to the first supply voltage terminal, a gate connected to the first node, a drain connected to the N-type substrate.

3. The output buffer circuit according to claim 2, which further comprises:
- a fifth N-channel type MOS transistor having a drain connected to the first node and a gate connected to the first supply voltage terminal; and
- a resistance connected between a source of said fifth N-channel type MOS transistor and the second supply voltage terminal.

4. The output buffer circuit according to claim 3, which further comprises a sixth N-channel type MOS transistor having a source and a drain both connected in parallel to said resistance and a gate for inputting the first pre-buffer control signal.

5. The output buffer circuit according to claim 4, which further comprises a seventh N-channel type MOS transistor having a source and a drain both connected in parallel to said resistance and a gate for inputting the second signal.

6. The output buffer circuit according to claim 5, which further comprises:
- a third pre-buffer circuit connected to the output terminal, for inverting data given through the output terminal from outside of the output buffer circuit and for outputting a fourth signal;
- a second main buffer circuit connected to said third pre-buffer circuit, for inverting the fourth signal outputted by said third pre-buffer circuit and for outputting a fifth signal; and
- an eighth N-channel type MOS transistor having a source and a drain both connected in parallel to said resistance and a gate for inputting the fourth signal.

7. The output buffer circuit according to claim 3, which further comprises a seventh N-channel type MOS transistor having a source and a drain both connected in parallel to said resistance and a gate for inputting the second signal.

8. The output buffer circuit according to claim 7, which further comprises:
- a third pre-buffer circuit connected to the output terminal, for inverting data given through the output terminal from outside of the output buffer circuit and for outputting a fourth signal;
- a second main buffer circuit connected to said third pre-buffer circuit, for inverting the fourth signal outputted by said third pre-buffer circuit and for outputting a fifth signal; and
- an eighth N-channel type MOS transistor having a source and a drain both connected in parallel to said resistance and a gate for inputting the fourth signal.

9. The output buffer circuit according to claim 1, which further comprises:
- a fifth N-channel type MOS transistor having a drain connected to the first node and a gate connected to the first supply voltage terminal; and
- a resistance connected between a source of said fifth N-channel type MOS transistor and the second supply voltage terminal.

10. The output buffer circuit according to claim 9, which further comprises a sixth N-channel type MOS transistor having a source and a drain both connected in parallel to said resistance and a gate for inputting the first pre-buffer control signal.

11. The output buffer circuit according to claim 10, which further comprises a seventh N-channel type MOS transistor having a source and a drain both connected in parallel to said resistance and a gate for inputting the second signal.

12. The output buffer circuit according to claim 11, which further comprises:
- a third pre-buffer circuit connected to the output terminal, for inverting data given through the output terminal from outside of the output buffer circuit and for outputting a fourth signal;
- a second main buffer circuit connected to said third pre-buffer circuit, for inverting the fourth signal outputted by said third pre-buffer circuit and for outputting a fifth signal; and
- an eighth N-channel type MOS transistor having a source and a drain both connected in parallel to said resistance and a gate for inputting the fourth signal.

13. The output buffer circuit according to claim 9, which further comprises a seventh N-channel type MOS transistor having a source and a drain both connected in parallel to said resistance and a gate for inputting the second signal.

14. The output buffer circuit according to claim 13, which further comprises:
- a third pre-buffer circuit connected to the output terminal, for inverting data given through the output terminal from outside of the output buffer circuit and for outputting a fourth signal;
- a second main buffer circuit connected to said third pre-buffer circuit, for inverting the fourth signal outputted by said third pre-buffer circuit and for outputting a fifth signal; and
- an eighth N-channel type MOS transistor having a source and a drain both connected in parallel to said resistance and a gate for inputting the fourth signal.

15. An output buffer circuit, comprising:

a pre-buffer control circuit for inputting data and an enable signal, and for outputting a first pre-buffer control signal and a second pre-buffer control signal;

a first pre-buffer circuit for inputting the first pre-buffer control signal outputted by said pre-buffer control circuit and outputting a first signal, including:

a first P-channel type MOS transistor having a gate for inputting the first pre-buffer control signal;

a first N-channel type MOS transistor having a gate connected to a first supply voltage terminal;

a second N-channel type MOS transistor having a gate for inputting the first pre-buffer control signal; and said first P-channel type MOS transistor and said first and second N-channel type MOS transistors being all connected in series between a first node and the second supply voltage terminal, and the first signal being outputted from a second junction node between one end of said first P-channel type MOS transistor and one end of said first N-channel type MOS transistor;

a second pre-buffer circuit for inputting the second pre-buffer control signal outputted by said pre-buffer control circuit and outputting a second signal;

a main buffer circuit for inputting the first and second signals and outputting a third signal from an output terminal, including:

a second P-channel type MOS transistor having a gate for inputting the first signal;

a third N-channel type MOS transistor having a gate connected to the first supply voltage terminal;

a fourth N-channel type MOS transistor having a gate for inputting the second signal; and said second P-channel type MOS transistor and said third and fourth N-channel type MOS transistors being all connected in series between the first supply voltage terminal and a second supply voltage terminal, and a third junction node between one end of said second P-channel type MOS transistor and one end of said third N-channel type MOS transistor being connected to the output terminal;

a third P-channel type MOS transistor having a source connected to the first supply voltage terminal, a gate connected to the output terminal, and a drain connected to an N-type substrate and said first node;

a fourth P-channel type MOS transistor having a source connected to the second node, a gate connected to the first supply voltage terminal, and a drain connected to the output terminal; and a fifth P-channel type MOS transistor connected between an output of said first pre-buffer control signal and the gate of said first P-channel type MOS transistor and having a gate connected to the second supply voltage terminal.

16. The output buffer circuit according to claim 15, wherein said first, second, third, fourth and fifth P-channel type MOS transistors are all connected to the same N-type substrate, and which further comprises a sixth P-channel type MOS transistor having a source and a gate both connected to the first supply voltage terminal, and a drain connected to the gate of said first P-channel type MOS transistor.

* * * * *